United States Patent [19]

Schell

[11] Patent Number: 4,915,728

[45] Date of Patent: Apr. 10, 1990

[54] IRON/COBALT ALLOY FILAMENTS

[75] Inventor: Thomas E. Schell, Wyckoff, N.J.

[73] Assignee: GAF Chemicals Corporation, Wayne, N.J.

[21] Appl. No.: 252,100

[22] Filed: Oct. 3, 1988

[51] Int. Cl.$^4$ .............................................. C22B 5/20
[52] U.S. Cl. ...................................... 75/347; 75/362; 75/952; 75/348
[58] Field of Search .......... 75/0.5 AA, 0.5 BA, 0.5 C

[56] References Cited

U.S. PATENT DOCUMENTS 2,776,200  1/1957  Wallis ............................ 75/0.5 AA
2,884,319  4/1959  Fabian et al. ................... 75/0.5 AB Primary Examiner—L. Dewayne Rutledge
Assistant Examiner—George Wyszomierski
Attorney, Agent, or Firm—Richard T. Laughlin; Anthony Lagani Jr.; Joshua J. Ward

[57] ABSTRACT

A method of generating iron/cobalt alloy filaments which includes atomizing and spraying a solution of dicobalt octacarbonyl in iron pentacarbonyl through an atomizing hole (12) into a reaction chamber (14) surrounded by a solenoidal field (19), while simultaneously decomposing the solution to produce iron/cobalt filaments.

11 Claims, 1 Drawing Sheet

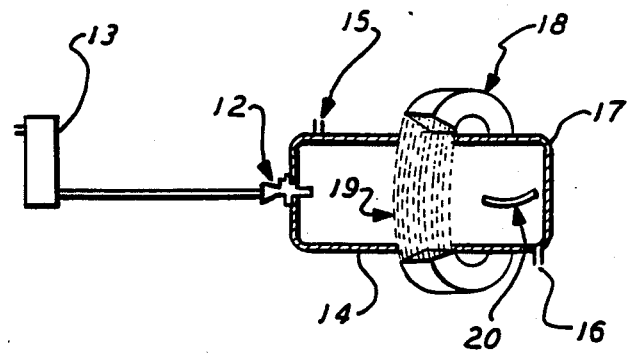

IRON/COBALT ALLOY FILAMENTS

This invention relates to a method for the decomposition of metal carbonyls in solution and, in particular, to the low cost generation of iron/cobalt alloy filaments.

THE PRIOR ART

Iron/cobalt alloy filaments have a number of applications in today's industry. Of major importance is the use of these alloy filaments in making magnetic recording tape. These alloy filaments are also used in the production of light weight permanent magnets.

As these alloy filaments are important to industry, there has been a need to produce the filaments in a less expensive fashion. The older methods of generating these filaments are costly due to the time involved in running the equipment needed to generate these filaments.

U.S. Pat. No. 2,884,319 issued on Apr. 28, 1959 to R. W. Fabian et al., discloses a process for the thermal decomposition of iron, cobalt and nickel carbonyls to achieve metal particles with a relatively great length to diameter ratio. This process teaches the use of a carrier gas that bubbles through the liquid carbonyl to control the concentration of the carbonyl. The acicular structure of the metal fibers is achieved by applying a 500 gauss magnetic field to the reaction chamber. This patent is directed primarily towards magnetic recording tape as the acicular structure of the fibers produced by this method is better for magnetic tape than spheroidal fibers as acicular fibers would require greater coercive force to change their polarization than the coercive force required for spheroidal fibers.

U.S. Pat. No. 3,172,776 issued on Mar. 9, 1965 to William A Manly, Jr., discloses a process for making magnetic tape. A polymer mixture of methyl methacrylate, ethyl acrylate and vinyl pyrrolidone is contacted with dicobalt octacarbonyl dissolved in toluene. This contact produces a dispersion of finely divided cobalt particles that are encased in resin. The patent is directed towards magnetic tapes which are of increased efficiency due to the alignment of the cobalt particles. The problem presented by this process is that the pulsed magnetic field must be precisely measured and homogenous throughout its field.

U.S. Pat. No. 3,200,007 issued on Aug. 10, 1965 to Dervin L. Flowers, discloses an improvement on the prior cited patent for a process of making magnetic tape. The patent teaches a novel polymer consisting of five different groups of monomers. This novel polymer is reactive with cobalt carbonyl so that a high percentage of cobalt can be combined with the polymer. Further, the dispersion can be readily reacted with other materials to produce a tape with improved mechanical and magnetic capabilities. This process yields a dispersion containing the cobalt in the polymer but does not yield clean cobalt particles. U.S. Pat. No. 3,228,882 issued on Jan. 11, 1966 to O. L. Harle, et al., discloses a method of arranging cobalt particles in an organic dispersion medium. The invention teaches producing cobalt particles that are ferromagnetic and single domain in their magnetic orientation. This arrangement is achieved by the decomposition of a cobalt-organic compound in the presence of an inert solvent and a polymer of at least 1,000 molecular weight. This invention is primarily concerned with magnetic recording mediums. The problem presented by this process is it also yields a dispersion containing cobalt and does not produce separate, distinct cobalt particles.

OBJECTS OF THE INVENTION

It is an object of the present invention to produce iron/cobalt alloy filaments in a less expensive fashion.

Another object of the invention is to produce cobalt coated carbonyl iron powder.

A further object of the invention is to produce iron/cobalt alloy filaments in a more efficient fashion.

A still further object of the invention is the accommodation of the widely different decomposition temperatures of iron pentacarbonyl and dicobalt octacarbonyl to produce a product of superior properties.

Other objects and the advantages of the invention will become apparent hereinafter from the following detailed description.

DESCRIPTION OF THE DRAWINGS

FIG. 1 is a representation of the elements involved in this invention.

GENERAL DESCRIPTION OF THE INVENTION

A mixture of dicobalt octacarbonyl and iron pentacarbonyl is atomized and sprayed into a heated reaction chamber which is surrounded by a solenoidal magnet. A heated carrier gas is inputted into the chamber to achieve more even decomposition of the mixture and then the gas is vented. The iron/cobalt filaments collect on the reaction chamber walls where they are collected.

DETAILED DESCRIPTION OF THE INVENTION

Dicobalt octacarbonyl crystals are dissolved in liquid iron pentacarbonyl at a temperature of about 60° F. to about 85° F. by using a magnetic stirring device under an inert gas atmosphere.

This liquid composition is then sprayed through an atomizer 12 into a reaction chamber 14. The rate of material fed to the reaction chamber 14 is regulated by a conventional variable controller 13. The temperature of the chamber is controlled by a conventional temperature control jacket 17 that allows for the internal temperature of the chamber to be varied.

A carrier gas composed of an inert gas such as carbon dioxide is inputted into the reaction chamber 14 through a conduit 15 and is vented after it has traveled through the chamber through exit port 16. The carrier gas flow rate is determined by a conventional external control (not shown). The temperature of the carrier gas is controlled by a conventional variable in-line heater (not shown). A solenoidal magnetic field 19 surrounds the reaction chamber and is created by electromagnet 18. The iron/cobalt filaments collect on the walls of the chamber.

In the second stage of the process the cobalt-coated carbonyl particles are collected from the walls of the chamber. In this second stage a conventional condenser illustrated at 20 separates the solvent vapor from the carrier gas.

The following examples are given for purposes of illustration.

EXAMPLE 1

A reaction chamber is maintained at a temperature of 675° F. Carbon dioxide is utilized as a carrier gas and is heated to 650° F. A flow rate for the gas is maintained at 400 SCFH. A 550 gauss solenoidal magnetic field is maintained in the reaction chamber. A mixture of 35.5 weight percent cobalt carbonyl dissolved in iron pentacarbonyl is fed into the reaction chamber through an atomizing nozzle. The feed rate through the atomizing nozzle is maintained at 20.8 g/min. with an 80:1 carrier gas ratio. The gas is vented from the reaction chamber and the solvent vapor is separated from the gas. The cobalt filaments are removed from the reaction chamber walls. The filaments contain 9.6 percent cobalt.

EXAMPLE 2

The process of Example 1 was repeated except that the carrier gas flow rate was 200 SCFH and the rate of the liquid feed was 19.0 g/min. resulting in a 44:1 carrier gas ratio. The cobalt composition of the resulting filaments was 12.2 percent.

EXAMPLE 3

The process of Example 1 was repeated except that the temperature of the reaction chamber decomposer was 650° F., the flow rate of the carrier gas was 600 SCFH and the rate of the liquid feed was 22.8 g/min. resulting filaments were composed of 7.5 percent cobalt.

EXAMPLE 4

The process of Example 1 was repeated for the flow rate of the carrier gas which was 150 SCFH and the liquid feed rate was 27.4 g/min. to give a 23:1 carrier gas ratio. The resulting cobalt composition of the filaments was 7.9 percent.

Various modifications of this invention will be apparent to one skilled in the art and in so far as such modifications are within the scope of the invention they are intended to be included within the scope of the claims

What is claimed is:

1. A method of generating iron/cobalt alloy filaments in a low cost, effective manner, which comprises:
   (a) introducing an inert, heated carrier gas into a reaction chamber;
   (b) heating said reaction chamber;
   (c) mixing a solution of crystal dicobalt octacarbonyl in liquid iron pentacarbonyl;
   (d) atomizing said liquid solution into the reaction chamber;
   (e) applying a solenoidal magnetic field to the reaction chamber;
   (f) decomposing said liquid solution in a simultaneous manner, thereby forming iron/cobalt alloy filaments;
   (g) venting said carrier gas from said reaction chamber; and
   (h) retrieving said iron/cobalt alloy filaments from said reaction chamber, in which said mixing of said liquid solution forms a mixture which is about 35.5 weight percent of dicobalt octacarbonyl in iron pentacarbonyl.

2. The method of claim 1 in which said mixing of said liquid solution occurs under an inert gas atmosphere.

3. The method of claim 2 in which said mixing of said liquid solution occurs at about 60° F. to about 85° F.

4. The method as defined in claim 1 in which said reaction chamber is maintained at a temperature of from about 650° F. to about 675° F.

5. The method of claim 1 in which said carrier gas is carbon dioxide.

6. The method of claim 5 in which the flow rate of the carrier gas ranges from about 150 SCFH to about 600 SCFH.

7. The method of claim 6 in which the carrier gas is heated by an in-line heater to a temperature of about 650° F.

8. The method of claim 1 in which a solenoidal magnetic field is provided to said reaction chamber and the solenoidal magnetic field measures about 550 gauss.

9. The method of claim 1 in which a solenoidal magnetic field is provided to said reaction chamber and the solenoidal magnetic field is supplied by a Helmholtz coil.

10. A method of generating iron/cobalt alloy filaments in a low cost, effective manner, which comprises:
    (a) introducing an inert, heated carrier gas into a reaction chamber;
    (b) heating said reaction chamber;
    (c) mixing a solution of crystal dicobalt octacarbonyl in liquid iron pentacarbonyl;
    (d) atomizing said liquid solution into the reaction chamber;
    (e) applying a solenoidal magnetic field to the reaction chamber;
    (f) decomposing said liquid solution in a simultaneous manner, thereby forming iron/cobalt alloy filaments;
    (g) venting said carrier gas from said reaction chamber; and
    (h) retrieving said iron/cobalt alloy filaments from said reaction chamber, in which said spraying of said solution into the reaction chamber ranges from about 19.0 to about 27.4 grams per minute.

11. A method of generating iron/cobalt alloy filaments in a low cost, effective manner, which comprises:
    (a) introducing a heated carbon dioxide carrier gas into a reaction chamber;
    (b) heating said reaction chamber;
    (c) mixing a solution of crystal dicobalt octacarbonyl in liquid iron pentacarbonyl;
    (d) atomizing said liquid solution into the reaction chamber;
    (e) applying a solenoidal magnetic field to the reaction chamber;
    (f) decomposing said liquid solution in a simultaneous manner, thereby forming iron/cobalt alloy filaments;
    (g) venting said carbon dioxide carrier gas from said reaction chamber; and
    (h) retrieving said iron/cobalt alloy filaments from said reaction chamber.

* * * * *